Figure 1:
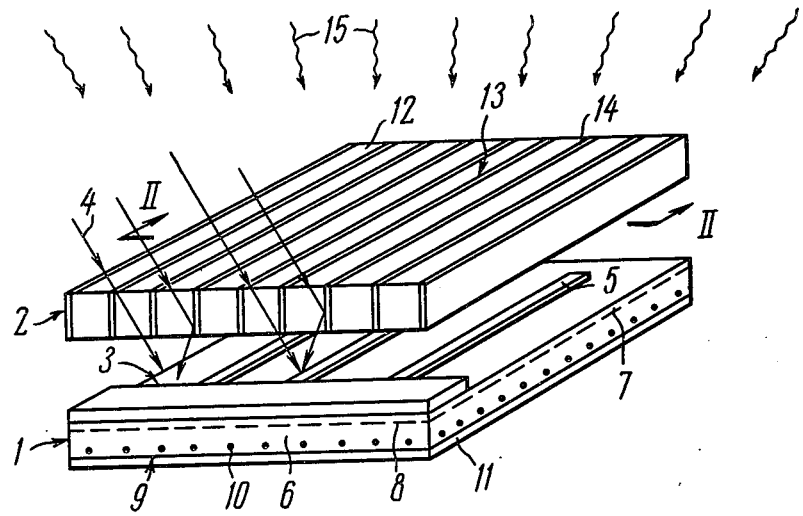

United States Patent [19]

Strebkov et al.

[11] 4,151,005

[45] Apr. 24, 1979

[54] RADIATION HARDENED SEMICONDUCTOR PHOTOVOLTAIC GENERATOR

[76] Inventors: Dmitry S. Strebkov, Kirovogradsky proezd, 3, korpus 1, kv. 17; Vitaly V. Zadde, poselok Severny, 9, linia, 3, kv. 120; Vadim A. Unishkov, ulitsa Bazhova, 15, korpus 1, kv. 162; Tatyana A. Litsenko, ulitsa Trubnaya, 11, kv. 12, all of Moscow, U.S.S.R.; Arkady P. Landsman, deceased, late of Moscow, U.S.S.R.; by Olga V. Nekljudova, administratrix, Rizhsky proezd, 3, kv. 140, Moscow, U.S.S.R.

[21] Appl. No.: 779,007

[22] Filed: Mar. 18, 1977

[51] Int. Cl.² .............................................. H01L 31/06
[52] U.S. Cl. ............................ 136/89 CC; 136/89 PC
[58] Field of Search .......... 136/89 PC, 89 CC, 89 SJ; 350/288, 292

[56] References Cited

U.S. PATENT DOCUMENTS

| | | | |
|---|---|---|---|
| 3,018,313 | 1/1962 | Gattone | 136/89 |
| 3,780,722 | 12/1973 | Swet | 126/270 |
| 3,873,829 | 3/1975 | Evrard et al. | 250/213 R |
| 3,928,073 | 12/1975 | Besson et al. | 136/89 |
| 3,985,116 | 10/1976 | Kapany | 126/270 |
| 4,021,267 | 5/1977 | Dettling | 136/89 PC |
| 4,042,417 | 8/1977 | Kaplow et al. | 136/89 PC |

*Primary Examiner*—John H. Mack
*Assistant Examiner*—Aaron Weisstuch
*Attorney, Agent, or Firm*—Lackenbach, Lilling & Siegel

[57] ABSTRACT pg,1 The semiconductor photovoltaic generator comprises one or several photovoltaic converters, each of which is provided with a rectifying barrier, which separates its base region from the inversion region, and with at least two current collector contacts, one of which being connected to the base region and the other being connected to the inversion region. The operating surface of the semiconductor photovoltaic generator is covered with a protection layer which receives the direct incident radiation and passes the photoactive part of the spectrum thereof to the operating surface of the semiconductor photovoltaic generator. The protection layer comprises elements transparent to the photoactive part of the incident radiation and intermediate metal layers to protect the photovoltaic converter material from the radiation effects which are liable to damage the semiconductor and lower the performance of the semiconductor photovoltaic generator.

18 Claims, 20 Drawing Figures

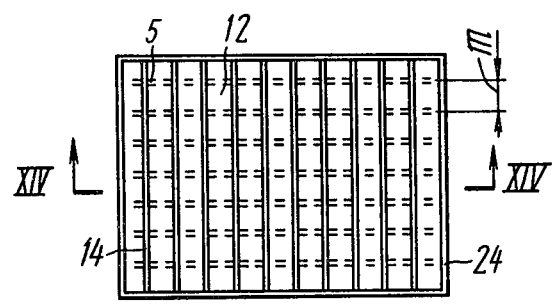
FIG. 13
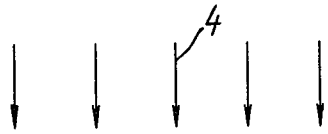
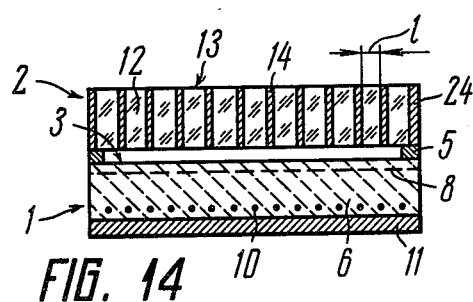
FIG. 14

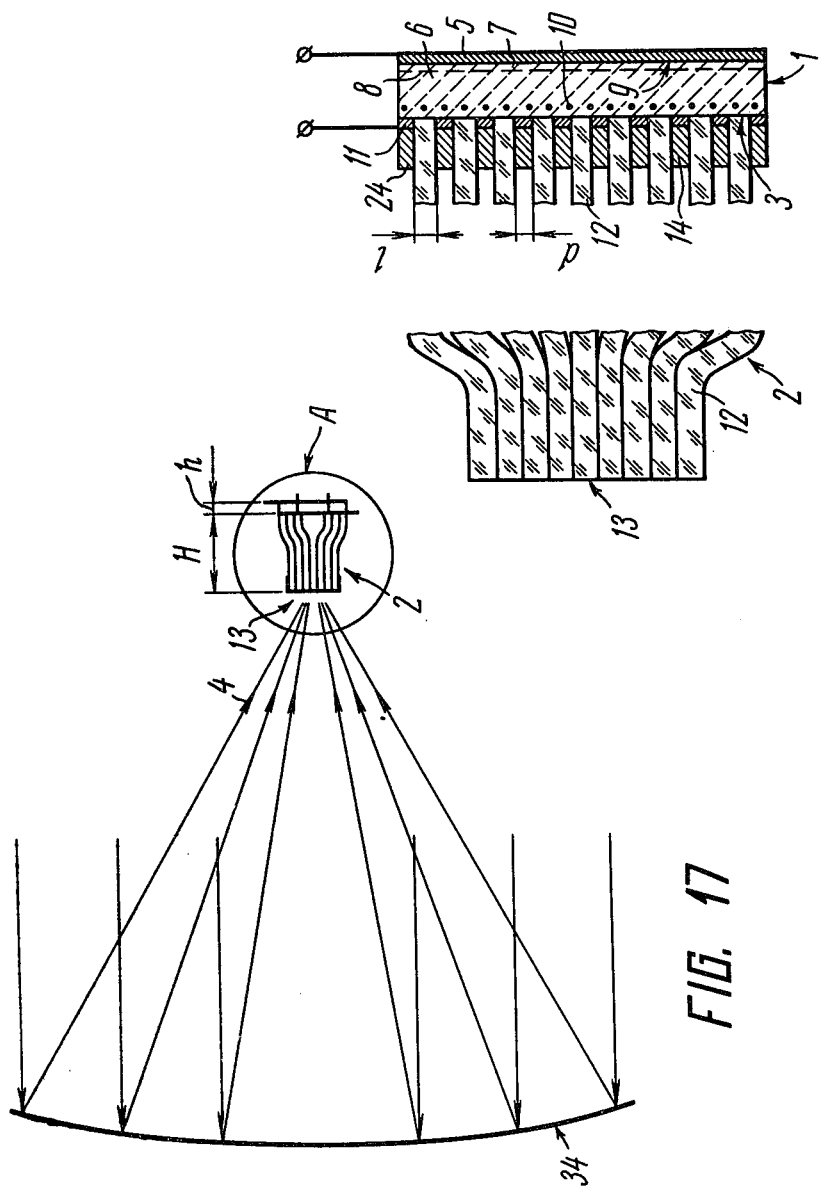

RADIATION HARDENED SEMICONDUCTOR PHOTOVOLTAIC GENERATOR

The invention relates to devices designed to convert radiation energy into electric energy and in particular to semiconductor photovoltaic generators that are used to produce solar cell arrays for space vehicles and for ground-based solar power stations.

The prior art includes a semiconductor photovoltaic generator comprising photovoltaic converters interconnected electrically.

The photovoltaic converter is made as a plate of semiconductor material in which a p-n junction is produced by means of doping, the junction serving as a rectifying barrier which separates current carriers in accordance with the polarity of their charges.

Thus, the p-n junction separates the base region having one type of conduction due to current carriers that form the majority in the base region from the inversion region having the opposite type of conduction due to current carriers that form the majority in the inversion region but belong to the minority in the base region. The base region also comprises an isotype junction. In a p-type base region this junction has a p-p$^+$ structure, while in an n-type base region the isotype junction has an n-n$^+$ structure.

Current collector contacts are connected to the base region and to the inversion region which in this case is obtained by means of doping, i.e. it represents a doped layer. The thickness of the base region is commensurate with the diffusion length L of the minority current carriers in the base region. The thickness of the inversion region (or the doped layer) is hundreds of times as small as the thickness of the base region. The p-n junction is located near the operating surface of the semiconductor photovoltaic generator which receives the incident radiation. The p-n junction is separated from the operating surface by the doped layer and the isotype junction is shifted from the operating surface of the semiconductor photovoltaic generator and located close to its opposite rear surface.

The current collector contacts connected to the doped region that comes out onto the operating surface of the semiconductor photovoltaic generator have a comb-like structure. They occupy no more that 10% of the operating surface area of the semiconductor photovoltaic generator. The current collector contact connected to the base region is made as a thin metal plate occupying the whole of the rear surface of the semiconductor photovoltaic generator. Therefore, such generators have but one operating surface. Their series resistance for the operating surface area including the area occupied by the current collector contact is comparatively high (in the order of several tenths of Ohm/cm$^2$). The major components of the series resistance are the spread resistance in the thin doped region and the base region resistance for the current flowing along the thin narrow bands of the current collector contact on the operation surface. A high value of the series resistance lowers the efficiency of the generator when the incident energy power exceeds 0.5 W/cm$^2$.

With an increase of the depth where the p-n junction is located, the spectral sensitivity of such generators is lowered while if this junction is brought out closer to the surface, there will be an increase of the spread resistance in the doped layer and a growth of the leakage current flowing through the p-n junction.

Reduction of the gaps between the current collector contacts and an increase of their widths will result in a drop of the series resistance and, due to the fact that the operating surface of the semiconductor photovoltaic generator is shadowed by the current collector contacts to a higher degree a decrease in the efficiency of the generator.

Also known in the art is a semiconductor photovoltaic generator made as a solid-state array of microminiature photovoltaic converters.

These photovoltaic converters are designed as microminiature parallepipeds combined in a solid-state array by metal current colector contacts which are arranged along all the side facets of said microminiature parallepipeds. The side facets are tilted by a certain angle with respect to the operating surface of the semiconductor photovoltaic generator. The p-n junction planes are located on one, two, three, four or five parallepiped facets while the width of each microminiature parallepiped base is about equal to the diffusion length L of the minority current carriers in the base region.

The resistance of the current collector contacts of such semiconductor photovoltaic generators is negligible (about several thousands of Ohms). However, the spread resistance that exists in the doped layer located in the immediate vicinity of the operating surface will lower the efficiency of such semiconductor photovoltaic generators when the radiation power exceeds 50 W/cm$^2$.

Besides, the above semiconductor photovoltaic generator made as a solid-state array has a high leakage current flowing through the p-n junction. If there is no p-n junction near the operating surface and the base region constitutes the major part thereof, the current losses will increase due to the process of minority current carrier recombination in the base region on the surface of the microminiature photovoltaic converter facets that are free of the p-n junction.

The prior art also includes a photovoltaic generator made of photovoltaic converters which are connected electrically and have p-n junctions and isotype junctions in the base region. The isotype junctions are located in the immediate vicinity of the operating surface of the semiconductor photovoltaic generator and the p-n junctions are removed from the operating surface by a distance which does not exceed the diffusion length L of the minority current carriers in the base region.

In such a semiconductor photovoltaic generator low power losses caused by the spread resistance in the base region and by the resistance of the current collector contacts will be obtained only when at least two linear dimensions of a microminiature photovoltaic converter are commensurate with the diffusion length L of the minority current carriers in the base region. However, the surface areas of the base region of such photovoltaic converters that are located between the p-n junction and the isotype junction considerably exceed the area of the p-n junction in size and the recombination rate of carriers on them is quite high, which prevents the current carriers generated by the incident light from reaching the p-n junction and, thereby causes excessive current and voltage losses.

Known also is a semiconductor photovoltaic generator whose operating surface is provided with a protection cover made of a transparent material, such as methyl methacrylate, which seals the photovoltaic converters hermetically and guards them from the damaging effects of the environment. The protection cover may also form an optical lens to focus the radiation that passes through it.

A common drawback of all the above semiconductor photovoltaic generators is that their efficiency will drop at an accelerated pace under the effect of damaging radiation due, for instance, to cosmic rays, radiation belts of the earth and thermonuclear reactions.

When a semiconductor photovoltaic generator receives a sufficiently high dose of accelerated charged particles that form damaging radiation, the amount of the current or voltage produced by it will drop due to radiation caused defects in the semiconductor structure and to the reduction of the diffusion length L of the minority current carriers.

The radiation resistance of the known semiconductor photovoltaic generator designs is achieved by means of introducing certain dopants of the required concentration into the base region. It is known that the radiation resistance of a base region made of a p-type silicon will be several times as high as that of a base region made of a n-type silicon. Besides, the lower the doping concentration in the base region the higher the radiation resistace. However, it is impossible for all known semiconductor photovoltaic generators to operate for a long time without additional protection against the damaging radiation. Such protection can only be provided with the use of protection covers of a considerable thickness (about 1 mm) placed onto the operating surface of a semiconductor photovoltaic generator.

It is quite evident that the use of thick glass, quartz or sapphire protection layers as well as the provision of excessive power reserves in semiconductor photovoltaic generators designed to serve as power supplies on board space vehicles makes them cumbersome and heavy and decreases their weight characteristics.

The prior art includes a method of raising the ability of glass to absorb the damaging radiation. It consists of doping the glass with materials of a heavy atomic weight (for instance, lanthanides). However, high concentrations of such dopants reduces the glass optical properties.

Known in the art is a semiconductor photovoltaic generator comprising a set of photovoltaic converters arranged in such a manner that their thin inversion region appears at the operating surface of the semiconductor photovoltaic generator. Connected to the base and to the inversion regions are current collector metal contacts made in the inversion region in the form of a comb. The operating surface is covered with a protection layer made as a glass plate bearing metallization bands in areas which correspond to those where current collector contacts are located on the operating surface of the semiconductor photovoltaic generator. The protection layer is soldered to the generator by said metallization bands.

This design of a semicnductor photovoltaic generator does not provide for increased radiation resistance since the absorption properties of a protection layer depends only on the thickness of the glass plate. Besides, the problem of finding an optimum ratio between the area occupied by the current collector contacts on the operating surface and the value of the series resistance of the generator is not solved either since an increase of the current collector contact area will result not only in the reduction of the series resistance but also in the shadowing of the operation surface, which does not allow high efficiencies especially in cases of high radiation powers exceeding 1 W/cm$^2$.

The object of the present invention is to provide a semiconductor photovoltaic generator having an increased resistance to damaging radiation while preserving the same size and weight.

Another object of the present invention is to reduce the series resistance of the semiconductor photovoltaic generator and to raise its efficiency irrespective of the radiation energy concentration, including concentrations exceeding 1 W/cm$^2$.

Still another object of the invention is to increase the current and voltage sensitivity of the semiconductor photovoltaic generator.

The above objects are achieved by means of a semiconductor photovoltaic generator comprising: at least one photovoltaic converter whose rectifying barrier separates the base region having one type of conduction due to the majority current carriers for the base region from the inversion region having the opposite type of conduction due to the minority current carriers for the base region: at least two current collector contacts one of which being connected to the base region and the other being connected to the inversion region; and a protection cover receiving the incident radiation and located at least on one operating surface of the semiconductor photovoltaic generator receiving the incident radiation that has passed through the protection cover. According to the invention, said protection cover is made as a set of elements touching each other at least near the receiving surface of the protection cover and allows at least a part of the radiation spectrum which is photoactive for the given photovoltaic converter to pass to the operating surface of the semiconductor photovoltaic generator. Intermediate layers which absorb the radiation damaging the photovoltaic converter are located between adjacent elements.

Preferably the protection cover in the semiconductor photovoltaic generator is made as an array of microminiature elements arranged in rows as a single layer, the thickness of the protection cover being commensurate with the linear dimension of the photovoltaic converter as measured in the direction orthogonal to the operating surface of the semiconductor photovoltaic generator.

Conveniently the protection cover elements are made as parallepipeds whose linear dimension as measured in the direction parallel to the operating surface of the semiconductor photovoltaic generator is commensurate with the diffusion length L of the minority current cariers in the base region, while the side facets limiting said linear dimension are tilted by an angle $0° < \phi < 180°$ with respect to the operating surface and the adjacent side facets are interconnected and fastened to one another through intermediate layers.

Preferably, the protection cover elements are made as cylinders the base diameter of which is commensurate with the diffusion length L of the minority current carriers in the base region, the cylinders being tilted by an angle $0° < \phi < 180°$ with respect to the operating surface of the semiconductor photovoltaic generator, interconnected and fastened to one another through intermediate layers.

Conveniently the intermediate layers of the protection cover are made of a current-conducting material and are connected electrically to the current collector contacts located on the operating surface of the semiconductor photovoltaic generator and coupled with a common current-carrying bus.

It is expedient that the base region thickness of the photovoltaic converter be less than the diffusion length L of the minority current carriers in the base region.

In an arrangement which is often convenient, all the intermediate layers of the protection cover touch the current collector contacts on the whole of the external surface of the latter protruding over the operating surface of the semiconductor photovoltaic generator.

Conveniently, at least a part of the protection cover elements are made of the semiconductor material forming photovoltaic converters.

It is expedient that the semiconductor photovoltaic converters, having separate current collector contacts, the converters being insulated electrically from each other and located in a row, the linear dimension of said photovoltaic converters as measured along the row in the plane of operation surface being commensurate with the diffusion length L of the minority carriers in the base region and the direction of the protection cover element rows being orthogonal to the direction of the photovoltaic converter rows.

In an arrangement which is often convenient, the protection cover elements are made as optical concentrators focusing the incident radiation into a focal spot so that the absorption zone of the radiation focused into the focal spot is located within the base region of the photovoltaic converter and shifted from the rectifying barrier by a distance smaller than the diffusion length L of the minority current carriers in the base region.

It is expedient that the protection cover of the semiconductor photovoltaic generator comprises two arrays of elements, the arrays being superimposed on each other so that the intermediate layers of one array are located at an angle with respect to those of the other array.

Preferably, the parts of the protection cover elements facing the operating surface of the semiconductor photovoltaic generator are arranged so as to diverge in a fan-like manner and the intermediate layers made of a current conducting material are connected electrically to the current collector contacts located on the operating surface.

It is expedient that every element of the protection cover operates in conjunction with a separate photovoltaic converter.

Conveniently, the semiconductor photovoltaic generator comprises phtovoltaic converters whose base regions serve as a section of the operating surface of the semiconductor photovoltaic generator covered with a dielectric, the intermediate layers of the protection cover being made of a current conducting material and being brought out to a common current carying bus connected to one pole of a DC power supply, the other pole of which being connected to the current collector contact on the operating surface of the semiconductor photovoltaic generator, and a layer of a current conducting material being provided between the dielectric layer and the protection cover, said layer being connected electrically to the intermediate layer.

It is expedient that the semiconductor photovoltaic generator comprises photovoltaic converters the base region of which serves as sections of the operating surface of the semiconductor photovoltaic generator, said sections being covered with a dielectric, the protection cover surface facing the operation surface of the semiconductor photovoltaic generator being also coated with a dielectric and a layer of a current conducting material being provided between said dielectric layers, the protection cover elements made of a semiconductor material being arranged in series in an electric network, one lead of which being connected to one of the current collector contacts of the photovoltaic converter and the other lead being connected to the current conducting layer.

A semiconductor photovoltaic generator designed according to the present invention exhibits an increased resistance to the damaging radiation while preserving the same size and weight, an increased efficiency even in case of higher concentrations of photoactive radiation and an increased current and volt age sensitivity.

Figure 2:
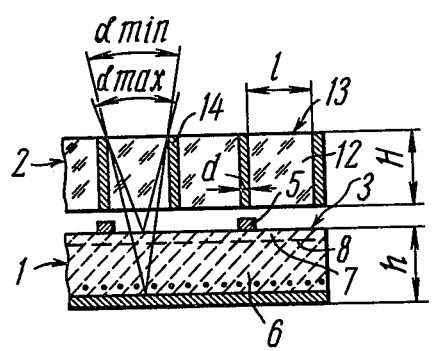
Figure 4:
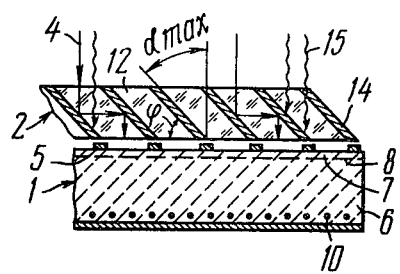
Figure 3:
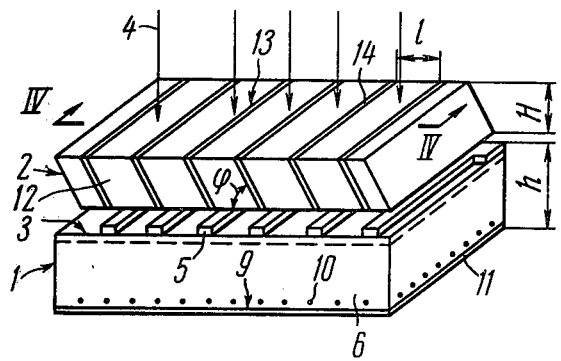
Figure 5:
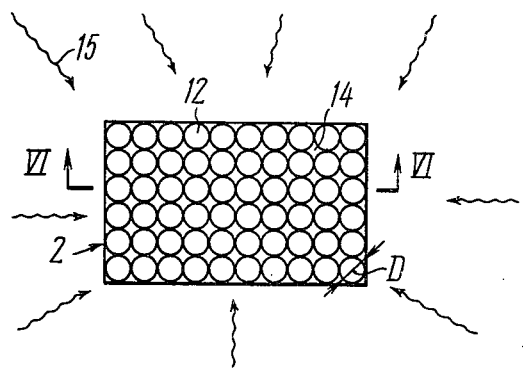
Figure 6:
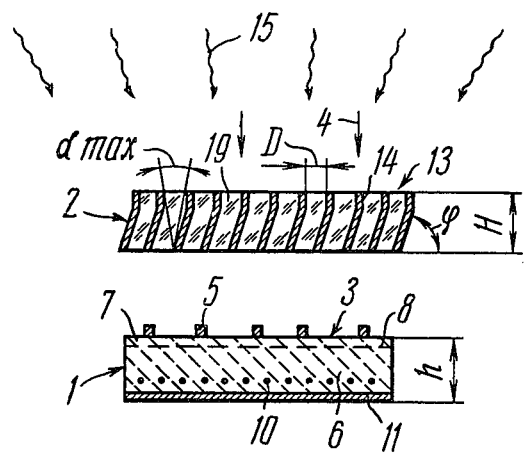
Figure 7:
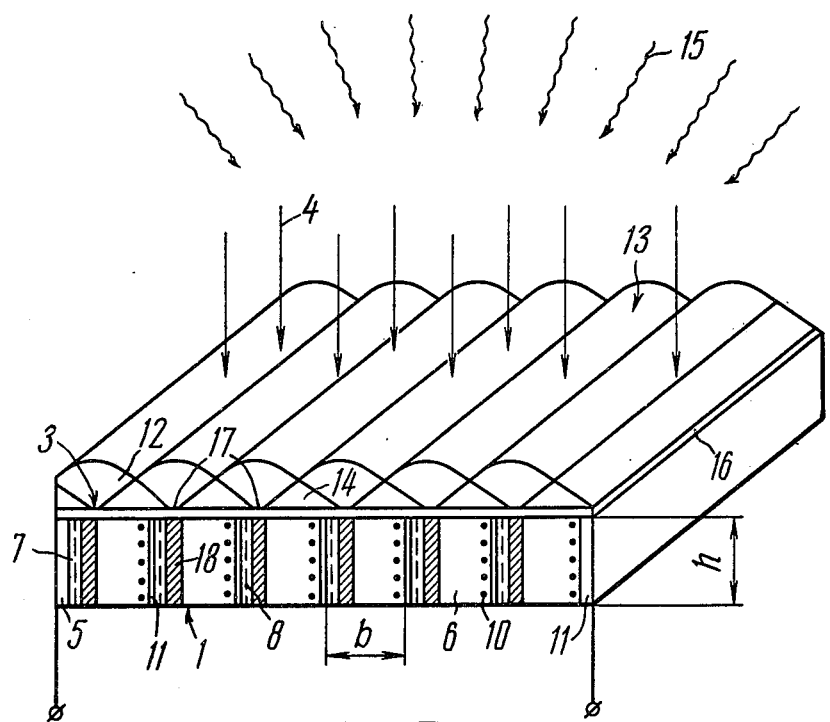
Figure 8:
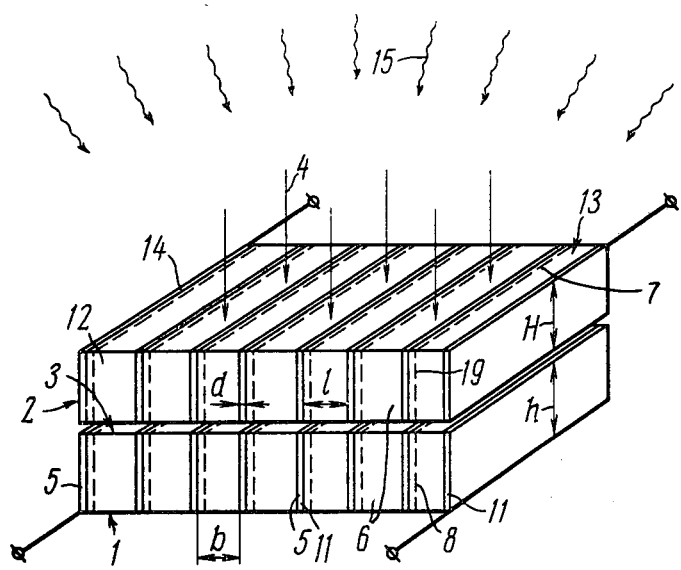
Figure 10:
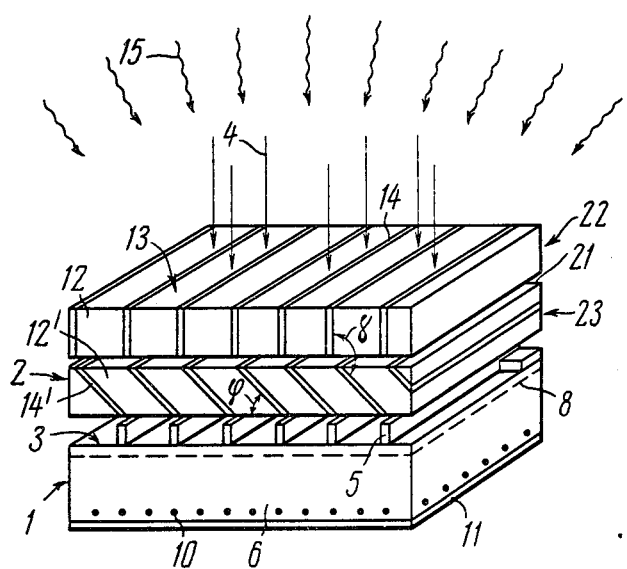
Figure 9:
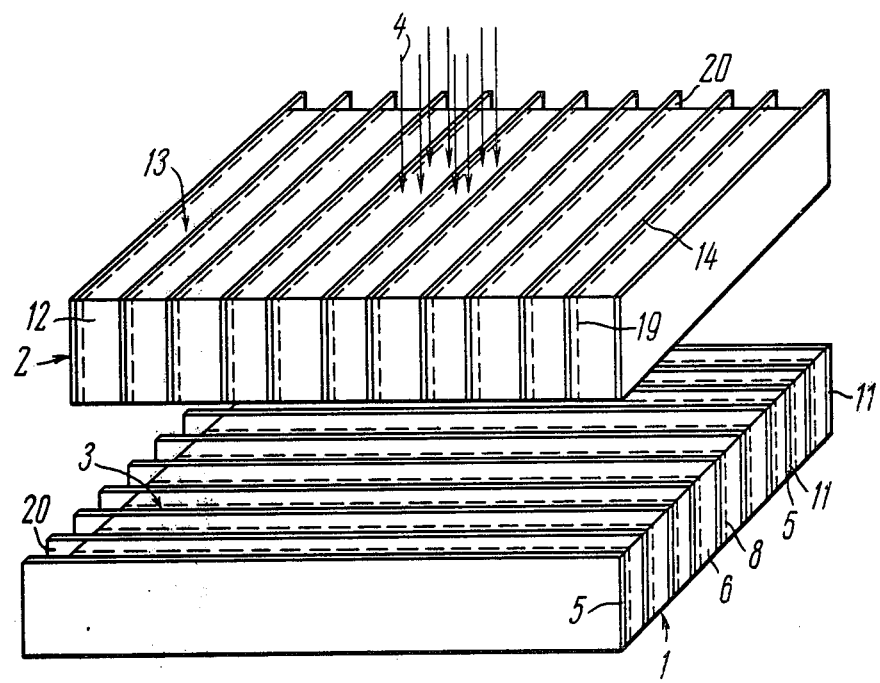
Figure 12:
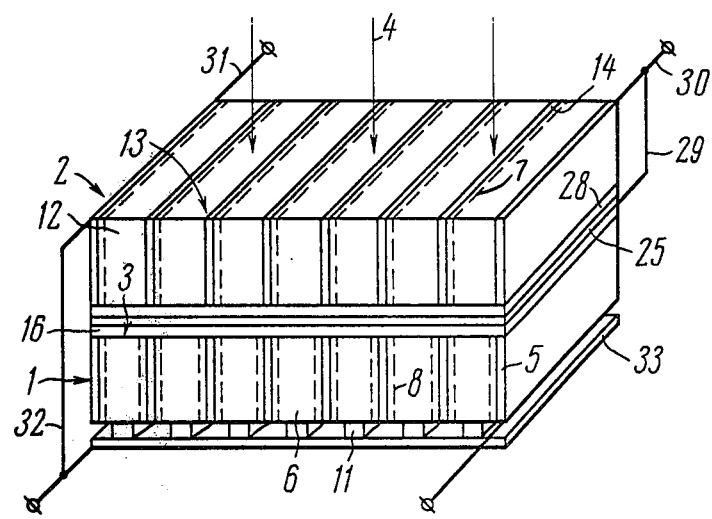
Figure 11:
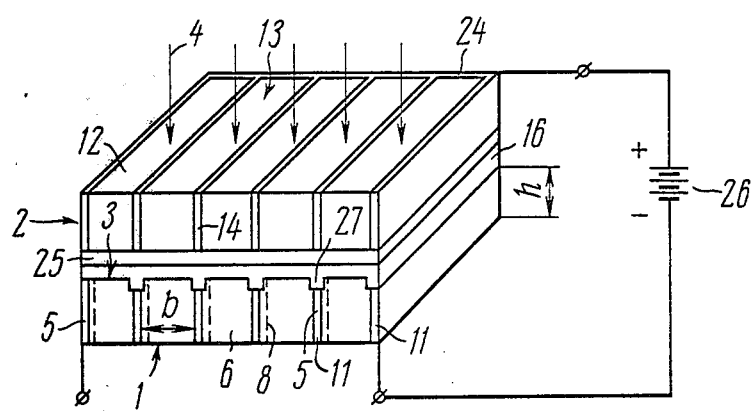
Figure 15:
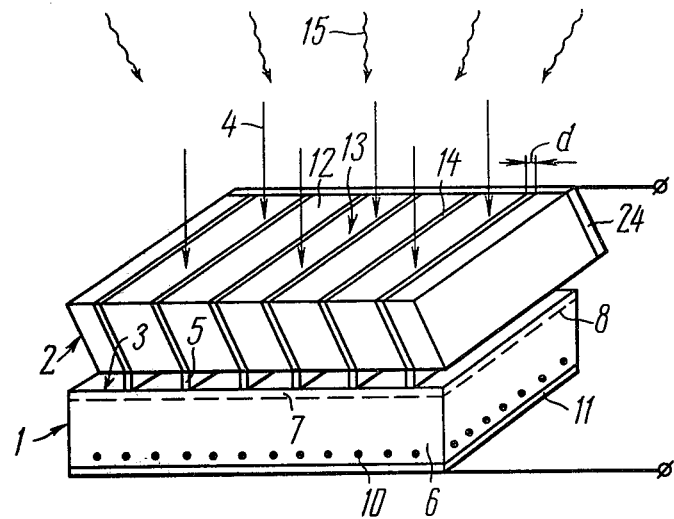
Figure 16:
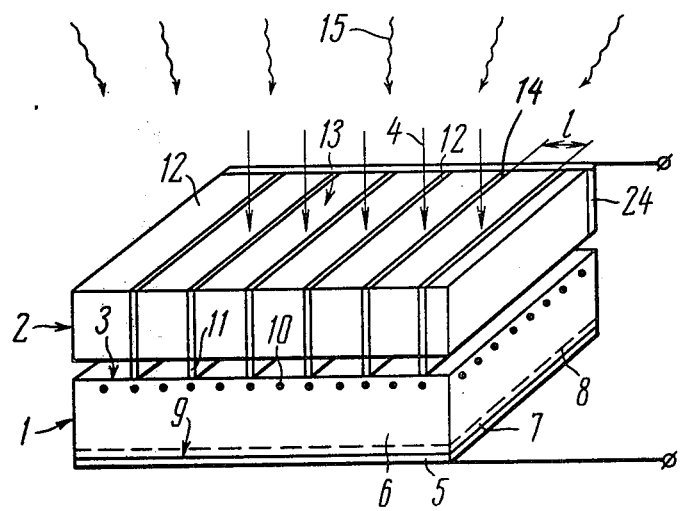
Figure 20:
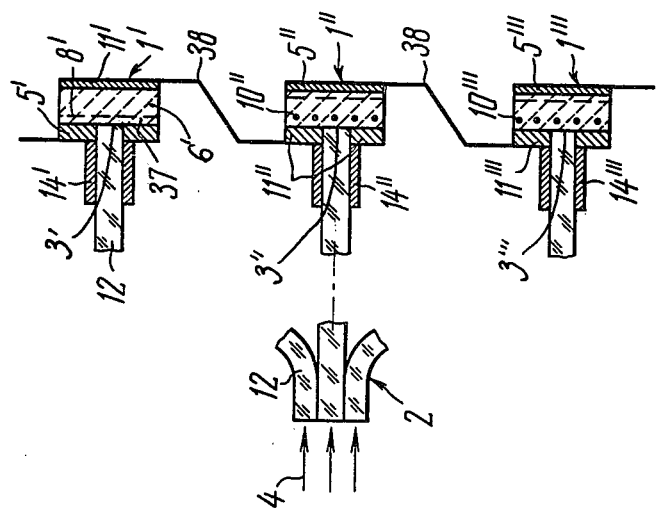
Figure 19:
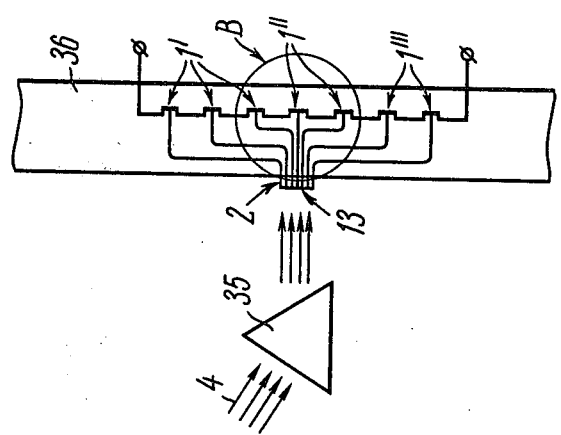

These and other objects of the invention will become apparent from the following detailed description of its embodiments taken as examples together with the accompanying drawings in which FIG. 1 is a perspective view of the semiconductor photovoltaic generator according to the invention;

FIG. 2 is a cross sectional view taken along the line II—II in FIG. 1 according to the invention, FIG. 3 is a perspective view of another embodiment of the semiconductor photovoltaic generator according to the invention, FIG. 4 is a cross sectional view taken along the line IV—IV in FIG. 3 according to the invention, FIG. 5 is a top view of another embodiment of the semiconductor photovoltaic generator according to the invention, FIG. 6 is a cross sectional view taken along the line VI—VI in FIG. 5 according to the invention, FIG. 7 is a perspective view of still another embodiment of the semiconductor photovoltaic generator according to the invention, FIG. 8 is a perspective view of a design version of the semiconductor photovoltaic generator having a protection cover made as an array of semiconductor elements according to the invention, FIG. 9 is a perspective view of still another embodiment of the semiconductor photovoltaic generator design having a protection cover made as an array of semiconductor elements according to the invention, FIG. 10 is a perspective view of the semiconductor photovoltaic generator with a two-layer protection cover according to the invention, FIG. 11 is a perspective view of still another embodiment of the semiconductor photovoltaic generator according to the invention, FIG. 12 is a perspective view of still another embodiment of the semiconductor photovoltaic generator according to the invention, FIG. 13 is a top view showing one of the possible design versions of the semiconductor photovoltaic generator according to the invention, FIG. 14 is a cross sectional view taken along the line XIV—XIV of the design version shown in FIG. 13 according to the invention, FIG. 15 is a perspective view of still another of the semiconductor photovoltaic generator according to the invention, FIG. 16 is a perspective view of still another of the semiconductor photovoltaic generator according to the invention, FIG. 17 is a drawing of the semiconductor photovoltaic generator provided with a sun radiation concentrator according to the invention, FIG. 18 is an enlarged view of the longitudinal section A of the design shown in FIG. 17 according to the invention, FIG. 19 is a drawing of still another design version of the semiconductor photovoltaic generator according to the invention, and FIG. 20 is an enlarged view of the longitudinal section B of a part of the semiconductor photovoltaic generator shown in FIG. 19 according to the invention.

Presented in FIG. 1 is a semiconductor photovoltaic generator comprising a photovoltaic converter 1 and a protection cover 2. To simplify the discussion of the design, the protection cover 2 and the photovoltaic converter 1 are shown in FIG. 1 as located at a certain distance from each other.

The operating surface 3 of the photovoltaic converter 1, which receives the radiation 4 passing through the protection cover 2 has a current collector contact 5 applied by means of vacuum spraying and having the form of a comb made of a titanium-palladium-silver metal layer.

The photovoltaic converter 1 is made as a plate of a semiconductor material, for instance, silicon, which forms a base region 6 with p-type conduction due to the majority current carriers ("holes") of the base region. Made in the same base region 6 by means of phosphorus doping is an inversion region 7 with n-type conduction due to electrons that serve as the majority current carriers of the inversion region 7. At the same time these electrons from the minority current carriers in the base region 6.

The boundary between the inversion region 7 and the base region 6 is a p-n junction 8 located in the immediate vicinity of the operating surface 3 of the semiconductor photovoltaic generator. Made by means of boron doping near the rear surface 9 of the semiconductor photovoltaic generator, which is opposite to the operating surface 3 of the latter, is a p-p+ isotype junction 10 serving to reduce the contact resistance between a second current collector contact 11 and the base region 6 as well as to reject electrons in the direction of the p-n junction 8.

One current collector contact 5 is connected to the inversion region 7 and is made, as it has been mentioned above, as a comb, while the second current collector contact 11 is made as a plae and covers the whole of the rear surface 9 of the semiconductor photovoltaic generator.

The protection cover 2 comprises a set of elements 12 made as glass light conducting pins having the form of parallepipeds. The elements 12 are arranged in one layer and form one row. One of the facets of the parallepipeds appears at the receiving surface 13 of the protection cover 2 which receives the direct incident radiation 4. The parallepiped elements 12 are interconnected along the whole of the area of their side facets through intermediate lead layers 14 which perform the function of radiation shields. The same side facets of the elements 12 bear a silver reflection coating (not shown in FIG. 1) deposited by means of vacuum spraying. Instead of silver any other material may be used provided its refraction index is smaller than that of the elements 12. The intermediate layers 14 and the elements 12 are bonded along the whole area of side facets by means of a glue or a solder.

The current collectors 5 on the operating surface 3 of the semiconductor photovoltaic generator correspond to the intermediate layers 14 in the arrangement and when the protection cover 2 is applied onto the operation surface 3 they become completely aligned with the intermediate layers 14. The protection cover 2 is fixed to the photovoltaic converter 1 with the use of a thin coat of glue.

The basic semiconductor material to serve as the base region 6 of the photovoltaic converter 1 is selected from substances having the greatest diffusion length of minority current carriers. The minority carrier diffusion length for silicon, for instance, is about 100 μm. In order to ensure that all the photoexcited minority current carriers are collected at the p-n junction 8, the thickness of the base region 6 should not exceed the diffusion length L of the minority current carriers in the base region 6. In practice it is equal to the thickness h (FIG. 2) of the photovoltaic converter 1.

The proposed semiconductor photovoltaic generator operates as follows.

The receiving surface 1 of the protection cover 2 is affected by radiation 4, shown as parallel straight lines representing solar rays, and by damaging radiation 15, which is distributed uniformly and directed isotropically in the environmental space (shown by wavy arrows 15). Having passed through the protection cover 2 the radiation 4 strikes the operating surface 3 of the semiconductor photovoltaic converter. It is not necessary that the operating surface 3 receive the whole amount of the radiation 4. What is important is that the operating surface 3 is reached by at least a part of the solar radiation which is photoactive for the given photovoltaic converter 1.

In the proposed version of the semiconductor photovoltaic generator using a silicon photovoltaic converter 1, the photoactive part of the radiation 4 will have a bandwidth of $0.4 \leq \lambda \leq 1.1$ μm. This radiation 4 produces excess minority current carriers in the converter which are collected at the p-n junction.

The radiation 4 passes through the protection cover 2 due in part to the internal reflection from the silver coated walls of the elements 12 and in part to the direct rays which preserve their initial direction. A part of the radiation 4 which is considered to be inactive in the photovoltaic sense will be reflected from the receiving surface 13 and absorbed in the glass of the elements 12.

The angle of incidence of the damaging radiation 15 does not coincide generally with the angle of incidence of the radiation 4. In contrast to the photoactive part of the radiation 4, the damaging radiation 15 is not reflected from the walls of the elements 12 when it passes through the protection cover 2. It is only that part of the damaging radiation 15 that has passed through the elements 12 without touching the intermediate layers 14 that reaches the photovoltaic converter 1. The rest of the damaging radiation 15 is absorbed to a considerable extent by the lead intermediate layers 14.

In the case of isotropic distribution of the damaging radiation 15 in the environment space, the efficiency of the protection cover 2 will be determined by the transmission coefficient "k" of the damaging radiation 15, the expansion angle $\alpha_{max}$ for the elements 12 determined in accordance to FIG. 2 and the transparency of the protection cover 2 for the photoactive part of the radiation 4, which depend on the dimensions l and H of the elements 12 as well as on the thickness d of the intermediate layers 14.

The parameters that determine the radiation resistance of a semiconductor photovoltaic generator in the plane orthogonal to the rows of the elements 12 are related to each other as follows.

$$\alpha_{max} = 2 \text{ arc } tg(1/2H) \tag{1}$$

The maximum transmission coefficient $K_{max}$ of the damaging radiation 15 is expressed as $$K_{max} = (\alpha_{max}/\pi) \quad (2)$$

The greater the height H of the elements 12 the better the absorption of the protection cover 2 and the smaller the expansion angle $\alpha_{max}$. However the maximum height of the elements 12 is limited first of all by the allowable size and weight of the generator, which should be made as small as possible, as well as by the loss in the photoactive part of the radiation 4 due to multiple reflections from the walls of the elements 12.

In accordance with the above considerations, optimum protection properties of the elements 12 for a given value of the height H will be ensured when the width 1 of the protection cover is either less than or equal to the height H. In this case the expansion angle $\alpha_{max}$ found with the use of expression (1) will be smaller than or equal to, 56°.

The most effective protection from the damaging radiation will be obtained from those layers of the base region 6 that are located at a greater depth from the operating surface 3 for which the expansion angle will be minimum $\alpha_{min}$.

In all instances it is desirable that the expansion angle $\alpha_{max}$ should be as small as possible. However, unlimited reduction of the width d of the elements 12 leads to an increase of the number of intermediate layers 14 per unit area of the operating surface 3, which results in shadowing of the latter by the opaque intermediate layers 14. It is desirable that the thickness d of the intermediate layers 14 should be made much smaller than the width 1 of the elements 12. However, reduction of the thickness d of the intermediate layers 14 is limited by the ability of the damaging radiation 15 to pass through the intermediate layers whose thickness is less than 1 μm.

If the proposed semiconductor photovoltaic generator is designed as shown in FIGS. 1 and 2 with a protection cover of glass elements 12 having l=0.3 mm and H=1 mm while the intermediate layers 14 located between the elements 12 are made of lead and have a thickness d=0.01 mm, the silicon photovoltaic converter 1 will receive more than 95% of the photoactive part of the incident radiation spectrum, the expansion angle $\alpha_{max}$ of the elements 12 of the protection cover 2 will be equal to about 15° and the transmission coefficient $k_{max}$ of the damaging radiation 15 will be equal to about 0.085. Hence, the radiation resistance of the proposed semiconductor photovoltaic generator with respect to damaging radiation 15 isotropically directed in the plane orthogonal to the rows of elements 12 forming the protection cover 2 will be about twelve times as high as that of the known protection cover made as a glass plate. The efficiency in this case remains unchanged and practically independent of the angle of incidence of the radiation 4 due to the low loss of the total internal reflection, which raises the output of the semiconductor photovoltaic generator used, for instance, as a section of a solar battary on board a space vehicle unstabilized in the direction of the sun.

The device shown in FIGS. 3 and 4 has a protection cover 2 made as a light-conducting array of microminiature parallepiped elements 12 tilted by an angle α with respect to the operating surface 3 (FIG. 3). The incident radiation 4 and the damaging radiation 15 are orthogonal to the receiving surface 13 of the protection cover 2. This semiconductor photovoltaic generator is characterized by low weight and small size, which is due to the fact that the thickness H of the protection cover 2 is reduced to a value commensurate with the thickness h of the photovoltaic converter 1. An increased radiation resistance of the generator is ensured due to the fact that the intermediate layers 12 are tilted with respect to the operating surface by an angle α other than 90°, since it results in a smaller maximum expansion angle $\alpha_{max}$ (FIG. 4).

Generally the value of the expansion angle $\alpha_{max}$ depends on the geometry of the elements 12 of the protection cover and can be determined as follows:

$$\alpha_{max} = \arctg \frac{\rho}{H} \text{ when } H = \rho \cdot \tg \phi \quad (3)$$

$$\alpha_{max} = \pi - \phi \arctg \left(\frac{H}{\rho H/\tg\phi}\right) \text{ when } H < \rho \cdot \tg \phi \quad (4)$$

$$\alpha_{max} = \arctg \left(\frac{H}{H/\tg\phi - \rho}\right) - \phi \text{ when } H > \rho \tg \phi \quad (5)$$

In the case of the generator designed as shown in FIG. 4, when $\phi < 90°$ and $H > l\tg\phi$, the damaging radiation 15 will be intercepted completely by the intermediate layers 14, while the photoactive part of the radiation 4 will reach the photovoltaic converter 1 only due to the total internal reflection.

If the damaging radiation 15 is directed isotropically and the protection cover 2 has H=1 mm, l=0.33 mm and $\phi=45°$, the transmission coefficient $K_{max}$ of the damaging radiation 15 in the plane orthogonal to the rows of the elements 12 of the protection cover 2 will be found from expressions (2) and (5) to be equal to 0.05. Hence, the radiation resistance of the proposed semiconductor photovoltaic generator is twenty times as high as that of the known semiconductor photovoltaic generator whose protection cover is made as a glass plate.

FIGS. 5 and 6 present two views of a semiconductor photovoltaic generator comprising a photovoltaic converter 1 and a protection cover 2 made as an array of microminiature elements 12 that have the form of cylinders. The diameter D of the cylinders and their height H (FIG. 6) are commensurate with the thickness h of the photovoltaic converter 1.

The elements 12 are interconnected by the intermediate layers 14, the direction of which near the receiving surface 13 is orthogonal to the latter and near the opposite surface of the protection cover 2 is tilted by an angle φ, which increases the efficiency of the protection cover 2 with respect to the damaging radiation 15. From FIG. 5 it is evident that in this case the protection against the damaging radiation 15 will be more efficient than in the case of the semiconductor photovoltaic generator version discussed above since its intermediate layers 14 surround every element 12 along the whole of its side surface and not only along its two side facets.

In the case of a greater angle φ through which the cylinder side surface is tilted, the solid expansion angle $\alpha_{max}$ will decrease and the protection properties of the semiconductor photovoltaic generator with respect to the damaging radiation will improve.

When selecting the values of the height H and the diameter D of the cylinders it is desirable to follow the considerations deduced for the case of selecting the dimensions of the protection cover 2 for the semiconductor photovoltaic generator shown in FIG. 1. Optimum protection properties against the damaging radiation 15 will be obtained when the cylinder diameter D is smaller than or equal to the height H since the expansion angle $\alpha_{max}$ will be reduced.

The best conditions for the incident radiation 4 to pass through will be achieved when the thickness $\alpha$ of the intermediate layers 14 is small and the height H is low.

Since the intermediate layers 14 near the receiving surface 13 are arranged at the angle of 90° towards the latter, there will be no backscatter irrespective of the angle of incidence.

Shown in FIG. 7 is a semiconductor photovoltaic generator comprising a multiple set of silicon photovoltaic converters 1 arranged in a monolithic structure. The converters 1 are made as microminiature parallepipeds whose width b and height h are approximately equal to the diffusion length L of the minority current carriers in the base region 6. In the plane orthogonal to the operating surface 3 the photovoltaic converters 1 comprise a p-n junction 8 and an isotype junction 10. The current collector contacts 5 connected to the inversion region 7 and the current collector contacts 11 connected to the base region 6 are also located in the plane orthogonal to the operating surface 3 and bond the adjacent photovoltaic converters 1 to one another.

The protection cover 2 comprises elements 12 made as glass optical concentrators condensing the incident radiation 4 and intermediate layers 14 made as metal prisms absorbing the damaging radiation 15. The protection cover 2 is attached to the photovoltaic converters 1 with the use of a glue coat 16. The elements 12 are arranged so that the distance from any point of the focal spot 17 of the elements 12 to the plane of the p-n junctions 8 is smaller than the diffusion length L of the minority current carriers in the base region of the photovoltaic converters 1.

The higher radiation resistance and efficiency of this semiconductor photovoltaic generator with respect to the semiconductor photovoltaic generators shown in FIGS. 1-6 is attributed to the fact that the intermediate layers 14 cover a greater part of the surface 3 of the photovoltaic converters 1 so that no more than 10% of the operating surface 3 remains unprotected. The parts of the operating surface 3 that remain unprotected against the damaging radiation 15 coincide with the focal spot 17 of the elements 12 which collects the whole of the photoactive part of the spectrum of the radiation 4 due to the internal reflection effects.

Although the regions 18 where the minority current carriers are generated under the effect of the photoactive part of the radiation 14 and the radiation defects caused by the damaging radiation 15 occur coincide in the base regions 6 of the photovoltaic converters 1, the efficiency of the semiconductor photovoltaic generator remains at the same level due to the fact that the distance between the p-n junction 8 and the regions 18 where the minority current carriers are generated is smaller than the diffusion length L of the minority carriers and, hence, all of them are able to reach the p-n junction.

However, if damaging radiation 15 continues to affect the semiconductor photovoltaic generator, the semiconductor structure will suffer from severe defects, with the result being a considerable reduction of the diffusion length L of the minority current carriers in the base region 6. This will lead to a reduction of the efficiency starting from the moment when the diffusion length L of the minority current carriers in the base region 6 becomes smaller than the distance between the focal point 17 and the p-n junction 8.

Thus, the amount of the additional radiation resistance of a semiconductor photovoltaic generator is proportional to the ratio of the diffusion length L of the minority current carriers in the base region 6 to the distance between the focal spot 17 and the p-n junction 8.

Since the photoactive part of the incident radiation 4 is absorbed in the base region 6 in the immediate vicinity of the p-n junction 8, the loss of the minority current carriers due to volume and surface recombination effects will become low, the collection coefficient of the minority current carriers at the p-n junction will grow and the efficiency of the semiconductor photovoltaic generator will improve.

Shown in FIG. 8 is a semiconductor photovoltaic generator in which a multitude of microminiature germanium photovoltaic converters 1 are interconnected with the help of current collector contacts 5 and 11 to form a monolithic structure. The values of the width b and height h of the photovoltaic converters 1 are commensurate with the diffusion length L of the minority current carriers in the base region 6.

The planes of the p-n junctions 8 and of the current collector contacts 5 and 11 are orthogonal to the operating surface 3. The protection cover 2 is designed as a solid-state array of elements 12 made of a semiconductor material, silicon in this case. The semiconductor material for the elements 12 is selected so as to ensure that the photoactive part of the incident radiation 4 passes through the protection cover 2. This will be possible only in the case when the forbidden gap width of the semiconductor material used to make the elements 12 of the protection cover 2 exceeds that of the material used to produce the photovoltaic converters 1 of the semiconductor photovoltaic generator.

The semiconductor material of every element 12 comprises a p-n junction 19 introduced into it by means of phosphorus doping; thus, every element 12 becomes a photovoltaic converter, while the intermediate layers 14 made of a current conducting material (in this case, of a nickel film) coated with a tin-lead solder (not shown in FIG. 8) serve as current collector contacts connected to the inversion region 7 and base region 6 of the elements 12 of the protection cover 2.

The width l of the protection cover elements 12 is equal to the width b of the photovoltaic converters 1 and the thickness d of the intermediate layers 14 is equal to the thickness of the current collector contacts 5 and 11.

The elements 12 of the protection cover 2 and the photovoltaic converters 1 are arranged so that they become aligned in their respective planes.

The intermediate layers 14 made of a nickel film and a tin-lead solder protect the device from the damaging radiation 15 in the same manner as shown in FIG. 1.

In order to ensure that the part of the radiation 4 spectrum located beyond the limits of the basic absorption band characteristic for the semiconductor material used to make the elements 12 reaches the operating surface 3 it is desirable that the initial material that is used be a highly resistant semiconductor, such as silicon, with a specific resistance exceeding 1 Ohm/cm, and that the side walls of the elements 12 should be coated a mirror metal layer, for instance, with aluminum, located under the nickel film.

The amount of protection provided for the photovoltaic converters 1 against the damaging radiation 15 in this case is equal to that provided for the semiconductor photovoltaic generator made as shown in FIG. 1. One of the differences, however, is that the protection cover 2 generates an additional amount of electrical energy itself. This energy is produced by the elements 12 of the protection cover 2 which convert the short-wave part of the incident radiation 4 into electricity, since the photovoltaic converters 1 are unable to do it efficiently.

The result is that the semiconductor photovoltaic generator presented in FIG. 8 comprises two arrays or two stages of photovoltaic converters 1 and each of them has a forbidden gap the width of which is optimal for the respective part of the incident radiation spectrum. Thus, it becomes possible to improve the spectral sensitivity of the semiconductor photovoltaic generator and to increase the amount of generated energy.

Presented in FIG. 9 is a semiconductor photovoltaic generator in which the protection cover 2 comprises semiconductor elements 12 designed as microminiature photovoltaic converters just as in the version of the semiconductor photovoltaic generator described above. The elements 12 of the protection cover are combined into a solid-state array. The microminiature photovoltaic converters 1 also form a solid-state array. The elements 12 of the protection cover and the photovoltaic converters 1 are provided with individual current collector contacts 20. The row of photovoltaic converters 1 and the row of elements 12 are arranged so that they are orthogonal to each other. The elements 12 that serve as photovoltaic converters convert the shortwave components of the spectrum of the incident radiation into electricity while the longwave components of the spectrum pass through to the operating surface 3 of the semiconductor photovoltaic generator. The distribution of the energy concentration due to the incident radiation 4 about the operation surface 3 is not uniform. The maximum of the energy is concentrated in one area and the radiated portion of the operational surface 3 has the shape of a spot. Every photovoltaic converter 1 and every element 12 produces a current and a voltage collected by separate current collector contacts 20 and being proportional to the concentration of the incident radiation Thus, the proposed version of the semiconductor photovoltaic generator can have a broader field of application when compared with the version presented in FIG. 8. The proposed semiconductor photovoltaic generator can be used, for instance, as a two-coordinate position sensor which would be able to track variations on the non-uniformity of radiation power concentration.

An electric signal appearing at individual current collector contacts and representing the variations of the parameters of the radiation 4 can, after amplification, be used to control systems tracking the radiation 4.

Presented in FIG. 10 is a semiconductor photovoltaic generator comprising photovoltaic converters 1 and a protection cover 2 designed as two arrays of glass elements 12 which are connected to each other by a layer 21 of transparent glue. Each light conducting array comprises elements 12 having the form of parallelepipeds and intermediate layers 14 made of a lead foil.

The side walls of the elements 12 and the intermediate layers 14 of an upper array 22 of the protection cover 2 are arranged orthogonally to the receiving surface 13, while the intermediate layers 14' and the side walls 12' in lower array 23 are tilted by an angle $\phi$ with respect to the operating surface 3. With respect to each other the arrays 22 and 23 are arranged so that the intermediate layers 14 and 14' coincide completely at the touching points forming an angle $\gamma$.

This arrangement of the intermediate layers 14 and 14' with the angle $\gamma$ between them improves the protection against the damaging radiation 15 striking the receiving surface 13 of the protection cover 2 at different angles. In the best case when the dimensions of the elements 12 and 12' and the angle $\gamma$ between the intermediate layers 14 and 14' are selected properly, the damaging radiation penetrating the structure along any straight line that crosses the receiving surface 13 will be absorbed by the intermediate layer 14 or 14' and the protection against the damaging radiation will be at a maximum.

In a semiconductor photovoltaic generator of this design the photovoltaic converter is shielded completely from the damaging radiation by the protection cover 2 and the photoactive part of the spectrum of the incident radiation 4 reaches the operating surface 3 due to the total internal reflection from the side walls of the elements 12 or 12'.

The design of a semiconductor photovoltaic generator as shown in FIG. 10 also makes it possible to improve its efficiency since it provides for a considerable reduction of that part of the operating surface 3 that is occupied by the intermediate layers 14 and 14' in comparison to the semiconductor photovoltaic generator designs presented in FIGS. 5 and 6.

Presented in FIG. 11 is a semiconductor photovoltaic generator comprising photovoltaic converters 1 made as microminiature parallepipeds whose widths b and heights h are commensurate with the diffusion length L of the minority current carriers in the base region 6. The photovoltaic converters 1 having p-n junctions 8 and isotype junctions (not shown) are combined into a solid-state unit with the help of current collector contacts 5.

The base region 6 serves as a part of the operating surface 3 coated with a layer 16 of glue made of a dielectric material.

The protection cover 2 is formed with intermediate layers 14 made of a metal which are connected to a common current-carrying bus 24 and connected electrically to a current conducting layer 25 located between the protection cover 2 and the dielectric glue layer 16. Connected to the current-carrying bus 24 is a pole of a DC power supply 26, the other pole of which being connected, via one of the current collector contacts 11, to the base region 6.

The current conducting layer 25 is made as a thin transparent film of, for instance, tin dioxide, which serves as an electrode controlling the strength of the electric field on the operating surface 3. In order to generate an electric field of a sufficiently high strength of about $10^6$ V/cm with a relatively low voltage of the power supply 26, the layer 16 of glue should be made as thin as possible.

When the negative pole of the power supply 26 is connected to the p-type base region 6 and the positive pole of the power supply 26 is connected to the common current-carrying bus 24, a constant voltage of about 100 V will appear between the current conducting layer 25 and the base region 6. Under these conditions the minority current carriers in the base region 6 (electrons) will collect near the operating surface 3 (the so called field effect) of the semiconductor photovoltaic generator. The concentration of electrons near the operating surface 3 will exceed that of the majority carriers in the base region 6. This results in the formation of an additional inversion region (not shown in FIG. 11) which is located parallel to the operating surface and separated from the base region 6 by an additional p-n junction (not shown in FIG. 11), the latter being connected with the p-n junction 8 already present in the base region 6.

In order to avoid the shunting of the additional p-n junctions by the current collector contacts 5 and 11, the operating surface 3 is provided with grooves 27 made by chemical etching. The depth of the grooves should be several times as great as the thickness of the glue layer 16 so as to reduce the strength of the electrical field at the bottom of the grooves 27.

When compared with the semiconductor photovoltaic generator shown in FIG. 1, the present semiconductor photovoltaic generator has a higher efficiency which is due to the field effect which forms an additional potential barrier for the minority current carriers on the whole of the operating surface 3. This additional potential barrier lowers the surface recombination of the minority current carriers practically to zero. Hence a layer rich in majority current carriers in the base region 6 is formed without any doping of the operating surface 3. Depending upon the sign of the charge on the n-type current conducting layer 25, this layer will become either an additional isotype junction or an additional inversion region and, consequently, an additional p-n junction. Due to small thickness and high electrophysical properties this additional inversion region improves the spectral sensitivity of the photovoltaic converters 1 in the shortwave band of the incident radiation 4 and raises the intensity of the generated photocurrent.

Presented in FIG. 12 is a semiconductor photovoltaic generator comprising photovoltaic converters 1 made as microminiature parallepipeds which are arranged in a parallel electric network and combined with the help of current collector contacts to form a solid-state unit. Each photovoltaic converter 1 is provided with p-n junctions 8 on its side facets and with current collector contacts 11 to the base region 6, which extend out of the operating surface 3 coated with a layer 16 of glue. The semiconductor elements 12 of the protection cover 2 are designed so that the width of their forbidden gaps exceeds that of the photovoltaic converter 1. These elements perform the function of microminiature photovoltaic converters interconnected in series via the intermediate layers 14 made of a metal. The surface of the protection cover 2 which faces the operating surface 3 is coated with a transparent dielectric film 28.

Located between the transparent dielectric film 28 and the dielectric glue layer 16 is a transparent current conducting layer 25 which serves as a control electrode. The current conducting layer 25 is connected, via a conductor 29, to the first lead 30 of the in-series network of the protection cover elements 12 which, as it has been already stated, represent a microminiature photovoltaic converter. The second lead 31 of the in-series network of the elements 12 of the protection cover 2 is connected, via a conductor 32, to the current collector contacts 11 extending out to a common current carrying bus 33 and, hence, to the base region 6 of the photovoltaic converters 1.

The number of elements 12 of the protection cover 2, the thickness of the glue layer 16 and the sign of the charge of the current conducting layer 25 are selected so that an electric field with a strength of about $10^6$ V/cm is formed on the operating surface 3 due to the field effect. The result is that an extra p-n junction (not shown in FIG. 12) appears in the immediate vicinity of and parallel to the operating surface 3. This extra p-n junction interconnects the p-n junctions 8 that were formed earlier.

The extra inversion region formed due to the field effect (see descriptions of semiconductor photovoltaic generators shown in FIGS. 11 and 12) is thinner than the inversion region 7 obtained by means of doping and the life time of the minority carriers in it exceeds that of the minority carriers in the inversion region. Hence, the spectral sensitivity of the photovoltaic converters 1 in the shortwave band is improved.

The semiconductor photovoltaic generator shown in FIG. 12 has a higher efficiency than the generators shown in FIGS. 8 and 11 in which the protection cover elements 12 are also made of a semiconductor material as photovoltaic converters. The efficiency is improved due to the fact that the elements 12 of the protection cover 2 are able to convert into electricity that part of the incident radiation 4 which is inactive, in the photovoltaic sense, for the photovoltaic converters 1.

Presented in FIGS. 13 and 14 is still another design version of the semiconductor photovoltaic generator. FIG. 13 shows a view from above and FIG. 14 shows the cross section of a side view.

Elements 12 (FIG. 14) of the protection cover 2 are made as glass parallepipeds. Intermediate layers 14 are made of a current conducting material, for instance, copper. These layers are interconnected and connected to a common current-carrying bus 24. The protection cover 2 is attached to the operating surface 3 of the semiconductor photovoltaic generator by connecting the intermediate layers 14 to the current collector contacts 5 by means of soldering, the intermediate layers 14 being arranged orthogonally to the rows of the current collector contacts 5 (FIG. 13). The current collector contact 11 (FIG. 14) to the base region is made as a solid plate.

The cross-sectional areas of the intermediate layers 14 are many times as great as that of the current collector contacts 5. The ohmic resistance of the intermediate layer 14 changes in proportion to the change of the ratio between said areas. The gap l between the intermediate layers 14 does not exceed 1 mm.

Thus, in addition to improved radiation resistance, the semiconductor photovoltaic generator design presented in FIGS. 13 and 14 exhibits low power losses caused by the resistance along the current collector contacts 5. An additional reduction of the series resistance of the photovoltaic converter 1 may also be obtained by decreasing the gap l<1 mm between the current collector contacts 5 whose width is about 10 μm.

Thanks to the low value of the series resistance of the photovoltaic converter 1 the semiconductor photovoltaic generator retains high efficiencies at increased concentrations (about 10 W per 1 sq. cm) of the incident radiation 4 and is able to generate up to 1 W of electricity per square centimeter of the area of the photovoltaic converter 1.

Presented in FIG. 15 is a semiconductor photovoltaic generator design in which the external surfaces of the current collector contacts 5 protruding above the operating surface 3 are completely aligned with and connected to the intermediate layers 14 of the protection cover 2. All the intermediate layers 14 are made of copper and connected to a common bus 24.

The material of the intermediate layer 14 will reduce the ohmic resistance along the current collector contacts by as many orders of magnitude as by which the height H of the intermediate layer 14 exceeds the thickness of a current collector contact 5. In order to reduce the spread resistance between the current collector contacts 5 in the inversion region above the p-n junction 8, the gap between the current collector contacts 5 is made less than 1 mm. The width of the current collector contacts 5 is made about equal to the thickness d of the intermediate layers 14 which does not exceed 0.1 mm.

The semiconductor photovoltaic generator designed as shown in FIG. 15 has a higher efficiency than the semiconductor photovoltaic generator shown in FIGS. 13 and 14 and produces about 5 W of electric power per 1 sq. cm of the area of the photovoltaic converter 1 at high concentrations of the incident radiation 4. This is attributed to the fact that the shadowing of the operating surface 3 by the intermediate layers 14 and the series resistance of the given design of the semiconductor photovoltaic generator are lower than those in other designs.

The photovoltaic converter 1 (FIG. 16) of the semiconductor photovoltaic generator has an isotype junction 10 located in the immediate vicinity of the operating surface 3 and a p-n junction 8 located near the rear surface 9, the p-n junction being shifted from the isotype junction 10 by a distance which is smaller than the diffusion length L of the minority current carriers in the base region 6.

The current collector contact 5 connected to the inversion region 7 is made as a plate of a nickel film with copper foil coating. It covers the whole of the rear surface 9 of the semiconductor photovoltaic generator. The intermediate layers 14 of the protection cover 2 are made of copper and are connected to the current collector contacts 11 protruding above the operating surface 3 and coupled with the base region 6. This design of the semiconductor photovoltaic generator makes it possible to reduce the spread resistance in the inversion region 7, which is separated from the base region 6 by the p-n junction 8, practically to zero. Moreover, the resistance along the current collector contacts 11 and the intermediate layers 14 connected together to a common current-carrying bus 24 is also negligibly small. Also quite low is the spread resistance in the base region 6 since the width 1 of the elements 12 of the protection cover 2 does not exceed the thickness of the base region 6. These are the reasons why at superhigh (above 50 W per 1 sq. cm) concentrations of the incident radiation 4 the given design of the semiconductor photovoltaic generator exhibits a high efficiency and a high output power.

When the width 1 of the elements 12 is small, the concentration of photogenerated current carriers in the base region 6 at incident radiation 4 levels of about 100 W/cm$^2$ will exceed the equilibrium concentration by several orders of magnitude. The result is that the spread resistance in the base region 6 is reduced almost in proportion to the increase of the incident radiation power 4 and to the growth of the operating range of the semiconductor photovoltaic generator in which the intensity of the generated power and current and the output power remain linearly dependent on the incident radiation energy 4.

Presented in FIG. 17 is a schematic of a semiconductor photovoltaic generator (in circle A) provided with a concentrator 34 of solar energy. The incident radiation 4 strikes the concentrator 34 and, on reflection from its surface, arrives at the receiving surface 13 of the protection cover 2 of the semiconductor photovoltaic generator.

FIG. 18 shows an enlarged view of the semiconductor photovoltaic generator presented schematically in circle A in FIG. 17.

The protection cover 2 (FIG. 18) comprises a set of elements 12 made as glass ribbons arranged close to one another near the receiving surface 13 of the protection cover 2 and diverging in a fan-like manner in the direction of the operating surface 3 and near the latter. The gaps between the ends of the diverging sections are 1 mm. Placed between them are the intermediate layers 14 made of copper and connected to a common current-carrying bus 24.

The protection cover 2 is attached to the operating surface 3 by means of soldering the intermediate layers 14 to the current collector contacts 11 of the photovoltaic converter 1.

The width of the gaps between the current collector contacts 11 is equal to the width of the elements 12. The total area of the gaps is equal therefore to the receiving surface 13 illuminated by the incident radiation 4.

The current collector contact 5 which is connected to the inversion region 7 is made as a solid piece. It covers the whole of the rear surface 9 and is soldered to a copper plate.

Located in the immediate vicinity of the operating surface 3 is an isotype junction 10. The p-n junction 8 is placed near the rear surface 9 of the semiconductor photovoltaic generator and is displaced from the isotype junction 10 by a distance which is smaller than the diffusion length L of the minority current carriers in the base region 6.

When compared with the semiconductor photovoltaic generator designed as shown in FIG. 16, the given device appears to have a higher efficiency, especially at superhigh concentrations of the incident radiation 4. This advantage is attributed to the fact that the intermediate layers 14 occupy no space on the receiving surface 13, due to which there are no losses in the incident radiation 4 that might otherwise by partially absorbed by the intermediate layers 14. The resistance of the current collector contacts 11 is also low, which reduces power losses to a minimum. The latter advantage is attributed to the fact that the design permits the intermediate layers 14 to be made comparatively thick. Hence, the current collector contacts 11 become rather wide, which reduces the value of the metal-semiconductor contact resistance.

A typical silicon photovoltaic converter 1 and an ordinary protection cover 2 will have the following dimensions: glass ribbons 0.3 mm thick occupy 1 cm$^2$ of the area of the receiving surface 12; the height H (FIG. 17), i.e. the ribbon length of the protection cover, is several centimeters; the width of the current collector contacts 11 and the thickness d (FIG. 18) of the intermediate layers 14 are 1 mm, the thickness h (FIG. 17) of the photovoltaic converter 1 is 0.1 mm; the depth at which the isotype junction 10 is located is about 0.1 mm and the diffusion length L of the minority current carriers in the base region 6 is about 0.5 mm.

The receiving surface 13 and the operating surface 3 are provided with anti-reflection coatings and the refractive index of the glass ribbon surfaces is lower than that of the glass itself.

At operating temperatures of 30°-40° C. and with incident radiation power of about 1000 W/cm² the efficiency of the semiconductor photovoltaic generator having the above design will exceed 10%.

Presented in FIG. 19 is a schematic of a semiconductor photovoltaic generator whose protection cover 2 is similar to that of the generator designed as shown in FIG. 18.

The incident radiation 4 strikes the receiving surface 13 after it is resolved into spectrum components by a prism 35. The photoactive part of the incident radiation passes along the elements 12 which are diverging in a fan-like manner, and arrives at the operating surface 3. Every photovoltaic converter 1 is made of a material whose forbidden gap has a width that corresponds to the maximum photosensitivity for the given wavelength of the incident radiation 4 which arrives at the operating surface 3.

The photovoltaic converters 1', 1" and 1'" may be made, for instance, of GaAs, Si and Ge respectively. They are placed inside a pipe 36 containing a cooling liquid.

FIG. 20 is an enlarged drawing of the part B of the semiconductor photovoltaic generator shown schematically in FIG. 19. The photovoltaic converter 1' having a base region 6' of GaAs is provided with a $Al_x Ga_{1-x}As$ heterojunction layer 37 located near the operating surface 3. The photovoltaic converters 1" and 1'" are made of Si and Ge respectively. They are provided with isotype junctions 10" and 10'" located near their operating surfaces 3" and 3'". The current collector contacts 5' of the photovoltaic converter 1' are bonded to the intermediate layers 14' by soldering. These contacts form a single metal current lead. The operating surfaces 3 of all the photovoltaic converters 1 are made as narrow slots 0.2-0.5 mm wide in the current collector contacts 5. These slots are interconnected with conductors 38 to form an in-series electrical network.

The current collector contacts 11" and 11'" of the photovoltaic converters 1" and 1'" are connected respectively to the intermediate layers 14" and 14'" of the protection cover 2.

A higher efficiency of this semiconductor photovoltaic generator, especially at superhigh concentrations of the incident radiation 4, is achieved due to the fact that the effective conversion of the incident radiation into electricity takes place in a broad spectral band at the most favorable temperature for the photovoltaic converters 1 while the incident radiation 4 is resolved into spectral components which enter the photovoltaic converters 1 via a surface having the maximum photosensitivity for the given wavelength. Generally every photovoltaic converter 1 may have several surfaces of this type through which it will receive the incident radiation.

The radiation resistance of the semiconductor photovoltaic converters shown in FIGS. 11–14 and 16–20 is similar to that of the generator shown in FIG. 1. The semiconductor photovoltaic generator shown in FIG. 15 is characterized in that it has an improved radiation resistance. In this respect this design is similar to that shown in FIGS. 3 and 4.

The production procedure of a semiconductor photovoltaic generator may be described as follows.

In particular, the semiconductor photovoltaic generator presented in FIG. 1 is made with the use of a silicon photovoltaic converter 1 manufactured in an ordinary way. The major steps of the production procedure are: preparation of the silicon wafer surfaces; creation of a p-n junction 8 and an isotype junction 10 by means of diffusing the respective dopants to a depth of 0.1-0.5 mm; application of current collector contacts 5 and 11; and application of the antireflection coating to the operating surface 3.

A protection cover 2 having low losses of the incident radiation 4 is obtained by means of boiling the glass ribbons in a water solution of acetic acid. The procedure makes it possible to produce a film on the glass surface with a lower refractive index than that of the glass itself. Sheets of lead foil are placed between each pair of glass ribbons. Then the ribbons are glued to one another along the whole of their side surfaces to form a stack. The stack is then cut into light-conducting arrays. The surfaces of the arrays are polished and the arrays are glued to the operating surface of the semiconductor photovoltaic generator so that the lead intermediate layers 14 forming the protection cover are aligned with respect to the current collector contacts 5.

The semiconductor photovoltaic generator as shown in FIGS. 3 and 4 is manufactured in a similar way, the only difference being that the light-conducting arrays for the protection cover 2 are cut out of the stack at an angle with respect to the glass ribbon plane.

The production procedure used to manufacture a semiconductor photovoltaic generator as shown in FIGS. 5 and 6 consists of the same steps as that used to manufacture the semiconductor photovoltaic generator as shown in FIG. 1. However, the stack is composed of glass rods bent in the required manner and glued to one another with a glue that comprises lead powder as a filler. Then the stack is cut into arrays at the required angle with respect to the side surfaces of the glass rods.

The production procedure used to manufacture a semiconductor photovoltaic generator as shown in FIG. 7 uses silicon wafers having metal coatings on two sides, a p-n junction 8 and an isotype junction 10. These wafers are soldered to one another along the whole of their side surfaces to form a stack. The stack is cut into arrays orthogonally to the junction plane; the array edges are trimmed; both surfaces of the array are polished and the operating surface 3 is provided with an antireflection coating. The protection cover 2 is made of profiled glass elements 12 after treating them in a boiling acetic acid-water solution. The elements are then arranged in a row and the spherical surface of the elements 12 is fixed with paraffin wax. The gaps between the elements 12 are filled with a glue having lead powder as a filler. Then the surface treated with glue is ground and polished until a focal spot 17 of the required size is obtained. The protection cover 2 is glued to the operating surface 3 so that the edge of the focal spot 17 coincides with the line where the p-n junction 8 appears at the surface.

The production procedure used to manufacture a semiconductor photovoltaic generator as shown in FIG. 8 uses germanium wafers having metal coatings on two sides and a p-n junction 8. These wafers are glued together to form a stack which is cut into arrays orthogonal to the plane of the p-n junctions. The array edges are trimmed and both surfaces of the array are polished. A silicon protection cover 2 is manufactured in the same way, the only difference being that at the silicon boundary the metal contacts form a mirror-like surface. The production procedure used to manufacture a semiconductor photovoltaic generator as shown in FIG. 9 is similar to that used to manufacture the generator shown in FIG. 8, the only difference being that an individual current collector contact is soldered to every photovoltaic converter 1 and to the elements 12 of the protection cover 2.

The production procedure of a semiconductor photovoltaic generator as shown in FIG. 10 uses the same steps as that of the generator shown in FIGS. 1 and 3, the only difference consisting in that the protection cover 2 of the elements 12 tilted by an angle $\phi$ with respect to the operating surface 3 is provided with an additional layer glued to it. The elements 12' of the second layer of the protection cover 2 are made so that the intermediate layers 14' are arranged orthogonally with respect to the receiving surface 13.

The production procedure used to manufacture a semiconductor photovoltaic generator as shown in FIG. 11 uses silicon wafers having metal coatings on both sides and a p-n junction 8. The wafers are glued to one another to form a stack. The stack is cut into arrays orthogonally with respect to the plane of the p-n junctions 8. The edges of the arrays are trimmed and their surfaces are polished. The protection cover 2 is manufactured in the way similar to that used to manufacture the protection cover 2 for the generator shown in FIG. 1. In this case, however, all the intermediate layers 14 are interconnected electrically and connected to a common current-carrying bus 24, and the surface of the protection cover 2 which is adjacent to the operating surface 3 is coated with a current conducting transparent layer of tin dioxide using, for instance, the method of spraying. The protection cover 2 is attached to the photovoltaic converter with the help of a thin coat 16 of glue which can withstand an electrical field of about 10 V/cm.

The production procedure used to manufacture a semiconductor photovoltaic generator as shown in FIG. 12 uses germanium plates having metal coatings on both sides and a p-n junction 8. The plates are soldered to one another to form a stack. The stack is cut into arrays. Both surfaces of each array are polished. Current collector contacts 11 are applied to the base region 6 of all the photovoltaic converters 1.

Using vacuum spraying technology the operation surface 3 is coated first with a transparent dielectric glass film 28 and then with a transparent tin dioxide layer.

The protection cover 2 comprising silicon wafers is manufactured in a manner similar to that employed to manufacture the protection cover 2 of the semiconductor photovoltaic generator as shown in FIG. 8.

The production procedure of a semiconductor photovoltaic generator as shown in FIGS. 13 and 14 consists of the same steps as those employed to manufacture the semiconductor photovoltaic generator shown in FIG. 1, the only difference being that the protection cover 2 is attached to the photovoltaic converter 1 by means of soldering the copper foil intermediate layers 14 to the current collector contacts 5.

The production procedure of a semiconductor photovoltaic generator as shown in FIG. 15 is similar to that of the above generator, the only difference being that the current collector contacts 5 are aligned with the intermediate layers 14 using photolithography means while the protection cover 2 performs the functions of the photomask.

The generator shown in FIG. 16 is produced by means of the same procedure as used to manufacture the generator shown in FIG. 15, the only difference being that the silicon photovoltaic converter 1 is provided with an isotype junction 10 on the operating surface 3 and the intermediate layers 14 are connected electrically to the current collector contacts 11.

The production procedure used to manufacture a semiconductor photovoltaic generator as shown in FIGS. 17 and 18 uses a silicon wafer having metal coatings on both sides, a p-n junction 8 and an isotype junction 10. Using photolithographic technology current collector contacts 5 are made to the isotype junction 10. The protection cover 2 is manufactured with the use of bent glass ribbons treated in a water solution of acetic acid. The side surfaces of the ribbons are metallized at one end, while at the other end the ribbons are glued to one another to form a solid package. The protection cover 2 is attached to the operating surface 3 by means of soldering the current collector contacts 5 to the metal intermediate layers 14.

The generator shown in FIG. 19 and 20 is manufactured in a manner similar to the one described above, the only difference being that the photovoltaic converters 1 are attached to the elements 12 of the protection cover 2 diverging in a fan-like manner one by one by means of soldering.

In all cases a Schottky barrier can be used instead of the p-n junction. The selection of a particular rectifying barrier, however, is based on the fact that the use of a Schottky barrier simplifies the generator production procedure while the use of a p-n junction results in a higher conversion efficiency.

The proposed procedures allow manufacture of a generator whose protection cover 2 comprises microminiature elements 12 the assembly of which could be mechanized.

In contrast to the designs of semiconductor photovoltaic generators known in the art, the present invention proposed herein increases the radiation resistance of the device by dozens of orders of magnitude while preserving the size and weight characteristics of ordinary semiconductor photovoltaic generators used in solar batteries on board space vehicles, which considerably increases the service life of the latter. It is an established fact that the protection cover 2 whose elements 12 are tilted with respect to the operating surface 3 at different angles $\phi$ can pass 95% of the radiation energy while lead intermediate layers 14 which are 0.05 mm thick intercept almost completely the flow of protons with energies of about several MeV.

Thus it becomes possible to construct long life satellites operating in the radiation belts of the earth.

In addition to the increased radiation resistance, the proposed generators can have higher efficiencies obtained by means of focusing the incident radiation and transferring it to the most photosensitive areas of the photovoltaic converters 1, by ensuring that the spectral components of the incident radiation are used to the utmost, by reducing the current losses due to surface and volume recombination of photogenerated current carriers, by an almost 100%-usage of the operating surface area, by reducing the series resistance to a minimum and by increasing the area of the heat sinking surface.

The result is that the generator can operate with an efficiency exceeding 10% at an incident radiation power exceeding 100 W/cm$^2$, which is 1000 times as high as the power of solar radiation at the surface of the earth. The cost of ground-based solar power stations per unit of generated electricity when they use silicon photovoltaic generators operating in conjunction with solar energy concentrations having a diameter of about 1 m is reduced almost 1000 times. At the same time the concentrated solar energy is resolved into separate components to be transmitted beyond the solar energy concentrator via optical waveguides.

The use of the field effect makes it possible to smoothly control the spectral sensitivity of the generator. When a silicon photovoltaic converter the variation of the charge in the current conducting layer 25 allows a change in the characteristic of spectral sensitivity from a narrow peak at a wavelength of about 1 $\mu$m to a broad flat region in the 0.5–1 $\mu$m range.

Such a generator can also be used for stabilizing an object in the direction of a light source about two axes, for instance, a solar battery can be stabilized towards the sun or the direction of a laser beam can be determined.

The sensitivity in this case is better than 0.8 V per every millimeter of the displacement of the light beam.

While the present invention has been described above in connection with its preferred embodiments those skilled in the art will easily understand that there can exist modifications and versions thereof without departing from the concept and scope of the invention.

These modifications and versions are to be construed as included into the spirit and scope of the invention and the appended claims.

What is claimed is:

1. A semiconductor photovoltaic generator comprising:
    at least one photovoltaic converter which converts incident radiation into electricity, said photovoltaic converter including an operating surface to receive said incident radiation,
    a base region having one type of conduction due to majority current carriers present in said base region,
    an inversion region having an opposite type of conduction due to minority current carriers present in said base region,
    a rectifying barrier separating said base region with one type of conduction from said inversion region with the opposite type of conduction;
    at least two current collector contacts,
    one of said current collector contacts being connected to said base region, and another of said current collector contacts being connected to said inversion region;
    a protection cover, through which said photovoltaic converter receives at least the photoactive part of the spectrum of said incident radiation which protects said photovoltaic converter from radiation which is damaging to said converter,
    said protection cover including a receiving surface which receives said incident radiation, said cover further comprising:
    a set of elements located adjacent to one another at least near said receiving surface made of a first material which transmits at least the photoactive part of the spectrum of said incident radiation to said operating surface of said photovoltaic converter; and
    intermediate layers located between said adjacent elements of said protection cover made of a second material which serves to absorb the radiation which is damaging to said photovoltaic converter.

2. A semiconductor photovoltaic generator as claimed in claim 1 wherein:
    said protection cover is made as an array of microminiature elements which are located in rows forming a single layer,
    the thickness of said layer being commensurate with the thickness of said photovoltaic converter as measured in the direction orthogonal to said operating surface.

3. A semiconductor photovoltaic generator as claimed in claim 2 wherein:
    said elements of said protection cover are made as optical concentrators focusing the energy of the incident radiation into a focal spot,
    a zone where said energy of said incident radiation focused in said focal spot is absorbed, being located in said region of said photovoltaic converter and being displaced from said rectifying barrier by a distance which is smaller than said diffusion length of said minority current carriers in said base region.

4. A semiconductor photovoltaic generator as claimed in claim 1 wherein:
    said elements of said protection cover are made as optical concentrators focusing the energy of the incident radiation into a focal spot,
    a zone, where said energy of the incident radiation focused in said focal spot is absorbed, being located in said base region of said photovoltaic converter and being displaced from said rectifying barrier by a distance which is smaller than said diffusion length of said minority current carriers in said base region.

5. A semiconductor photovoltaic generator comprising:
    at least one photovoltaic converter which converts incident radiation into electricity, said photovoltaic converter including an operating surface to receive said incident radiation, a base region having one type of conduction due to majority current carriers present in said base radiation, an inversion region having an opposite type of conduction due to minority current carriers present in said base region, a rectifying barrier separating said base region with one type of conduction from said inversion region with the opposite type of conduction;
    at least two current collector contacts, one of said current collector contacts being connected to said base region, and another of said current collector contacts being connected to said inversion region;
    a protection cover, through which said photovoltaic converter receives at least the photoactive part of the spectrum of said incident radiation which protects said photovoltaic converter from radiation which is damaging to said converter, said protection cover including a receiving surface which receives said incident radiation, a set of elements located adjacent to one another at least near said receiving surface which transmit at least the photoactive part of the spectrum of said incident radiation to said operating surface of said photovoltaic converter, said elements of said protection cover being made as parallepipeds, the width of said parallepipeds as measured in the direction parallel to said operating surface of said photovoltaic generator being commensurate with the diffusion length of said minority current carriers in said base region, side facets of each of said parallepipeds which set the limit of said width being tilted with respect to said operating surface of said semiconductor photovoltaic generator by an angle of $0 < \phi < 180°$; and intermediate layers located between said adjacent elements of said protection cover which serve to absorb the radiation which is damaging to said photovoltaic converter, said intermediate layers serving to interconnect and bond said adjacent side facets of said parallepipeds to each other.

6. A semiconductor photovoltaic generator as claimed in claim 5 wherein:

said protection cover is made as an array of microminiature elements which are located in rows forming a single layer, the thickness of said layer being commensurate with the thickness of said photovoltaic converters as measured in a direction orthogonal to said operating surface.

7. A semiconductor photovoltaic generator as claimed in claim 6 wherein;

said intermediate layers are made of a current conducting material;

said current collector contacts are located on said operating surface of said semiconductor photovoltaic generator; further comprising a common current-carrying bus; and wherein said intermediate layers are connected electrically to said current collector contacts located on said operating surface of said semiconductor photovoltaic generator and are connected to said common current-carrying bus.

8. A semiconductor photovoltaic generator as claimed in claim 7 wherein the width of said base region is smaller than the diffusion length of said minority current carriers in said base region.

9. A semiconductor photovoltaic generator as claimed in claim 7 wherein:

an external surface of the current collector contact extends above said operating surface of said semiconductor photovoltaic generator; and said intermediate layers are arranged so that they touch said current collector contacts along the whole of said external surface of said current collector contacts.

10. A semiconductor photovoltaic generator as claimed in claim 5 wherein said parallepipeds of said protection cover are made of a semiconductor material which forms additional microminiature photovoltaic converters.

11. A semiconductor photovoltaic generator comprising:

at least one photovoltaic converter which converts incident radiation into electricity, said photovoltaic converter including an operating surface to receive said incident radiation, a base region having one type of conduction due to majority current carriers present in said base region, an inversion region having an opposite type of conduction due to minority current carriers present in said base region, a rectifying barrier separating said base region with one type of conduction from said inversion region with the opposite type of conduction;

at least two current collector contacts, one of said current collector contacts being connected to said base region, and another of said current collector contacts being connected to said inversion region;

a protection cover, through which said photovoltaic converter receives at least a photoactive part of the spectrum of said incident radiation which protects said photovoltaic converter from radiation which is damaging to said converter, said protection cover including a receiving surface which receives said incident radiation, a set of elements located adjacent to one another at least near said receiving surface which transmit at least the photoactive part of the spectrum of said incident radiation to said operating surface of said photovoltaic converter, said elements and said protection cover being made as cylinders, the base of each of said cylinders having a diameter which is commensurate with the diffusion length of said minority current carriers in said base region, said cylinders being tilted with respect to said operating surface of said semiconductor photovoltaic generator by an angle of $0 < \phi < 180°$, side surfaces of said cylinders being aligned in parallel;

and intermediate layers located between said adjacent elements of said protection cover which serve to absorb the radiation which is damaging to said photovoltaic converter, said intermediate layers serving to bond said side surfaces of said cylinders to each other.

12. A semiconductor photovoltaic generator as claimed in claim 11 wherein:

said protection cover is made as an array of microminiature elements which are located in rows forming a single layer, the thickness of said layer being commensurate with the thickness of said photovoltaic converter as measured in the direction orthogonal to said operating surface.

13. A semiconductor photovoltaic generator as claimed in claim 12, wherein:

said intermediate layers of said protection cover are made of a current conducting material;

said current collector contacts are located on said operating surface of said semiconductor photovoltaic generator; further comprising a common current-carrying bus; and wherein said intermediate layers are connected electrically to said current collector contacts located on said operating surface of said semiconductor photovoltaic generator and are connected to said common current-carrying bus.

14. A semiconductor photovoltaic generator as claimed in claim 13 wherein the width of said base region is smaller than the diffusion length of said minority carriers in said base region.

15. A semiconductor photovoltaic generator comprising:

at least one photovoltaic converter which converts instant radiation into electricity, said photovoltaic converter including an operating surface to receive said instant radiation, a base region having one type of conduction due to majority current carriers present in said base region, an inversion region having an opposite type of conduction due to minority current carriers present in said base region, a rectifying barrier separating said base region with one type of conduction from said inversion region with the opposite type of conduction;

at least two current collector contacts, one of said current collector contacts being connected to said base region, and another of said current collector contacts being connected to said inversion region;

a protection cover, through which said photovoltaic converter receives at least a photoactive part of the spectrum of said incident radiation which protects said photovoltaic converter from radiation which is damaging to said converter, said protection cover including a receiving surface which receives said incident radiation, a set of elements located adjacent to one another at least near said receiving surface which transmit at least the photoactive part of the spectrum of said incident radiation to said operating surface of said photovoltaic converter, said elements being an array of microminiature elements which are located in rows forming a single layer, the thickness of said layer being commensurate with the thickness of said photovoltaic converter as measured in the direction orthogonal to said operating surface, said microminiature elements being made of a semiconductor material which forms additional microminiature photovoltaic converters; and intermediate layers located between said adjacent elements of said protection cover which serve to absorb the radiation which is damaging to said photovoltaic converter.

16. A semiconductor photovoltaic generator comprising:

at least one photovoltaic converter which converts incident radiation into electricity, said photovoltaic converter including an operating surface to receive said incident radiation, a base region having one type of conduction due to majority current carriers present in said base region, an inversion region having an opposite type of conduction due to the minority current carriers present in said base region, a rectifying barrier separating said base region with one type of conduction from said inversion region with the opposite type of conduction;

at least two current collector contacts, one of said current collector contacts being connected to said base region, and another of said current. collector contacts being connected to said inversion region;

a protection cover, through which said photovoltaic converter receives at least a photoactive part of the spectrum of said incident radiation which protects the photovoltaic converter from radiation which is damaging to said converter, said protection cover including a receiving surface which receives said incident radiation, a set of elements located adjacent to one another at least near said receiving surface which transmit at least a photoactive part of the spectrum of said incident radiation to said operating surface of said photovoltaic converter;

intermediate layers located between said adjacent elements of said protection cover which serve to absorb the radiation which is damaging to said photovoltaic converter;

a first array of said elements of said protection cover made as parallepipeds;

a second array of said elements of said protection cover made as parallepipeds;

an individual current collector contact for each of said elements of said protection cover;

an individual current collector contact for each of said photovoltaic converters; and wherein said first array is superimposed on said second array, and said intermediate layers of said first array are arranged at an angle with respect to said intermediate layers of said second array.

17. A semiconductor photovoltaic generator comprising:

at least one photovoltaic converter which converts incident radiation into electricity, said photovoltaic converter including an operating surface to receive said incident radiation, a base region having one type of conduction due to majority current carriers present in said base region, an inversion region having an opposite type of conduction due to minority current carriers present in said base region, a rectifying barrier separating said base region with one type of conduction from said inversion region with the opposite type of conduction;

at least two current collector contacts, one of said current collector contacts being connected to said base region and located on said operating surface, another of said current collector contacts being connected to said inversion region;

a protection cover, through which said photovoltaic converter receives at least a photoactive part of the spectrum of said incident radiation which protects said photovoltaic converter from radiation which is damaging to said converter, said protection cover including a receiving surface which receives said incident radiation, a set of elements located adjacent to one another at least near said receiving surface which transmit at least a photoactive part of the spectrum of said incident radiation to said operating surface of said photovoltaic converter, end sections of said elements of said protection cover facing said operating surface of said semiconductor photovoltaic generator, said end sections of said elements being arranged so as to diverge in a fan-like manner towards said operating surface of said semiconductor photovoltaic generator;

and intermediate layers located between said adjacent elements of said protection cover which serve to absorb the radiation which is damaging to said photovoltaic converter, said intermediate layers of said protection cover being made of a current conducting material, said current collector contact on said operating surface being connected electrically to said intermediate layers.

18. A semiconductor photovoltaic generator as claimed in claim 17 wherein each of said elements of said protection cover corresponds to an individual photovoltaic converter.

* * * * *